United States Patent
Lin et al.

(10) Patent No.: US 6,465,836 B2
(45) Date of Patent: Oct. 15, 2002

(54) VERTICAL SPLIT GATE FIELD EFFECT TRANSISTOR (FET) DEVICE

(75) Inventors: Chrong Jung Lin, Hsin-Tien (TW); Sheng-Wei Tsao, Hsinchu (TW); Di-Son Kuo, Hsinchu (TW); Jack Yeh, Hsin-Chu (TW); Wen-Ting Chu, Hsin-Chu (TW); Chung-Li Chang, Hsh-Chu (TW); Chia-Ta Hsieh, Tainan (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 09/821,199

(22) Filed: Mar. 29, 2001

(65) Prior Publication Data

US 2002/0140022 A1 Oct. 3, 2002

(51) Int. Cl.$^7$ .............................................. H01L 29/788
(52) U.S. Cl. ........................ 257/315; 257/316; 438/259
(58) Field of Search ................................ 257/315, 316, 257/317, 318, 319, 321, 329, 332, 336, 344; 438/259, 267, 270, 589

(56) References Cited

U.S. PATENT DOCUMENTS

| | | | |
|---|---|---|---|
| 5,315,142 A | * 5/1994 | Acovic et al. | 257/316 |
| 5,338,953 A | * 8/1994 | Wake | 257/321 |
| 5,576,567 A | * 11/1996 | Mori | 257/316 |
| 5,703,387 A | 12/1997 | Hong | |
| 5,705,415 A | * 1/1998 | Orlowski et al. | 438/259 |
| 5,751,038 A | * 5/1998 | Mukherjee | 257/316 |
| 6,087,222 A | 7/2000 | Jung Lin et al. | |
| 6,093,606 A | 7/2000 | Lin et al. | |
| 6,118,147 A | * 9/2000 | Liu | 257/315 |
| 6,124,608 A | * 9/2000 | Liu et al. | 257/315 |
| 6,130,453 A | 10/2000 | Mei et al. | |
| 6,147,378 A | * 11/2000 | Liu et al. | 257/316 |
| 6,180,461 B1 | * 1/2001 | Ogura | 438/267 |
| 6,180,980 B1 | * 1/2001 | Wang | 257/317 |
| 6,316,298 B1 | * 11/2001 | Lee | 438/267 |

* cited by examiner

Primary Examiner—Hoai Ho
Assistant Examiner—Andy Huynh
(74) Attorney, Agent, or Firm—Tung & Associates

(57) ABSTRACT

Within both a split gate field effect transistor (FET) device and a method for fabricating the split gate field effect transistor (FET) device there is formed within a semiconductor substrate a trench within whose sidewall is fully contained a channel region within the split gate field effect transistor (FET) device. Similarly, there is also formed within the split gate field effect transistor a floating gate electrode within the trench and covering within the trench a lower sub-portion of the channel region. Finally, the floating gate electrode in turn has formed vertically and horizontally overlapping thereover within the trench a control gate electrode which covers an upper sub-portion of the channel. The split gate field effect transistor (FET) device is fabricated with enhanced areal density and enhanced performance.

6 Claims, 1 Drawing Sheet

VERTICAL SPLIT GATE FIELD EFFECT TRANSISTOR (FET) DEVICE

BACKGROUND OF THE INVENTION

1. Field of the Invention

The present invention relates generally to split gate field effect transistor (FET) devices, as fabricated within semiconductor integrated circuit microelectronic fabrications. More particularly, the present invention relates to vertical split gate field effect transistor (FET) devices, as fabricated within semiconductor integrated circuit microelectronic fabrications.

2. Description of the Related Art

In addition to conventional semiconductor integrated circuit microelectronic fabrications having fabricated therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device fabricated within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an intergate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce charge, reduce charge or sense charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication for providing semiconductor integrated circuit microelectronic fabrication with non-volatile data storage characteristics.

In that regard, it is known in the art of semiconductor integrated circuit microelectronic fabrication that split gate field effect transistor (FET) devices are often difficult to fabricate with enhanced areal density and enhanced performance, in part since split gate field effect transistor (FET) devices are fabricated with generally enlarged multi-region channel regions within semiconductor substrates.

It is thus desirable within the art of semiconductor integrated circuit microelectronic fabrication, and in particular within the art of semiconductor integrated circuit microelectronic memory fabrication, to provide split gate field effect transistor (FET) devices with enhanced areal density and enhanced performance.

It is towards the foregoing objects that the present invention is directed.

Various non-volatile semiconductor integrated circuit microelectronic fabrications having formed therein associated semiconductor integrated circuit microelectronic devices with enhanced areal density, as well as methods for fabrication thereof, have been disclosed within the art of non-volatile semiconductor integrated circuit microelectronic fabrication.

Generally, such non-volatile semiconductor integrated circuit microelectronic fabrications have formed therein non-volatile semiconductor integrated circuit microelectronic devices at least portions of which are formed within trenches within semiconductor substrates which comprise the non-volatile semiconductor integrated circuit microelectronic fabrications.

Examples of such non-volatile semiconductor integrated circuit microelectronic fabrications having fabricated therein non-volatile semiconductor integrated circuit microelectronic devices at least portions of which are formed within trenches within semiconductor substrates which comprise the non-volatile semiconductor integrated circuit microelectronic fabrications are disclosed within, but not limited to: (1) Hong (U.S. Pat. No. 5,703,387) (a non-volatile semiconductor integrated circuit microelectronic fabrication having fabricated therein a split gate field effect transistor (FET) device having a floating gate electrode which is formed covering completely a sidewall of a trench within a semiconductor substrate); (2) Jung Lin et al. (U.S. Pat. No. 6,087,222) (a non-volatile semiconductor integrated circuit microelectronic fabrication having fabricated therein a split gate field effect transistor (FET) device having a floating gate electrode covering only a portion of a sidewall of a trench within a semiconductor substrate); (3) Lin et al. (U.S. Pat. No. 6,093,006) (a non-volatile semiconductor integrated circuit microelectronic fabrication having fabricated therein a stacked gate field effect transistor (FET) device having a floating gate electrode covering completely a sidewall of a trench within a semiconductor substrate); and (4) Mei et al. (U.S. Pat. No. 6,130,453) (a non-volatile semiconductor integrated circuit microelectronic fabrication having fabricated therein a split gate field effect transistor (FET) device having a floating gate electrode covering completely and extending above a sidewall of a trench within a semiconductor substrate).

Desirable within the art of non-volatile semiconductor integrated circuit microelectronic fabrication, and in particular within the art of non-volatile semiconductor integrated circuit microelectronic memory fabrication, are additional methods and materials which may be employed for forming split gate field effect transistor (FET) devices with enhanced areal density and enhanced performance.

It is towards the foregoing objects that the present invention is directed.

SUMMARY OF THE INVENTION

A first object of the present invention is to provide for use within a semiconductor integrated circuit microelectronic fabrication a split gate field effect transistor (FET) device, and a method for fabricating the split gate field effect transistor (FET) device.

A second object of the present invention is to provide the split gate field effect transistor (FET) device and the method for fabricating the split gate field effect transistor (FET) device in accord with the first object of the present invention, wherein the split gate field effect transistor (FET) device is fabricated with enhanced areal density and enhanced performance.

A third object of the present invention is to provide the split gate field effect transistor (FET) device and the method for fabricating the split gate field effect transistor (FET) device in accord with the first object of the present invention and the second object of the present invention, wherein the method for fabricating the split gate field effect transistor (FET) device is readily commercially implemented.

In accord with the objects of the present invention, there is provided by the present invention a split gate field effect transistor (FET) device and a method for fabricating the split gate field effect transistor (FET) device. To practice the method of the present invention, there is first provided a semiconductor substrate having formed therein a trench. There is also formed within: (1) an upper portion of the semiconductor substrate which includes an upper portion of a sidewall of the trench; and (2) a lower portion of the semiconductor substrate which includes a floor of the trench, a pair of source/drain regions which is separated by a lower portion of the sidewall of the trench which defines a channel region. There is also formed covering at least the channel region but not filling the trench a gate dielectric layer. There is then formed upon the gate dielectric layer and covering only a lower sub-portion of the channel region and not an upper sub-portion of the channel region a floating gate electrode. There is then formed upon the floating gate electrode an intergate electrode dielectric layer. Finally, there is then formed upon the intergate electrode dielectric layer a control gate electrode which vertically and horizontally overlaps within the trench the floating gate electrode and covers within the trench the upper sub-portion of the channel region.

Within the present invention "covering" is intended to include covering in a vertical direction and, more particularly, covering in a horizontal direction.

The method for fabricating the split gate field effect transistor (FET) device in accord with the present invention contemplates a split gate field effect transistor (FET) device fabricated in accord with the method for fabricating the split gate field effect transistor (FET) device in accord with the present invention.

The present invention provides for use within a semiconductor integrated circuit microelectronic fabrication a split gate field effect transistor (FET) device, and a method for fabricating the split gate field effect transistor (FET) device, wherein the split gate field effect transistor (FET) device is fabricated with enhanced areal density and enhanced performance.

The present invention realizes the enhanced areal density of the split gate field effect transistor (FET) device by fabricating the split gate field effect transistor (FET) device with a channel region contained completely within a trench within a semiconductor substrate within which is fabricated the split gate field effect transistor (FET) device. The present invention realizes the enhanced performance of the split gate field effect transistor (FET) device in part by forming within the trench and covering only a lower sub-portion of the channel region a floating gate electrode which in turn has formed vertically and horizontally overlapping thereover within the trench a control gate electrode which covers an upper sub-portion of the channel region within the trench.

The method for fabricating the split gate field effect transistor (FET) device in accord with the present invention is readily commercially implemented.

The present invention employs methods and materials as are generally known in the art of semiconductor integrated circuit microelectronic fabrication, but employed within the context of a specific process ordering and specific series of process limitations to provide a split gate field effect transistor (FET) device in accord with the present invention. Since it is thus a specific process ordering and a specific series of process limitations which provides at least in part the present invention, rather than the existence of methods and materials which provides the present invention, the method for fabricating the split gate field effect transistor (FET) device in accord with the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides, for use within a semiconductor integrated circuit microelectronic fabrication, a split gate field effect transistor (FET) device, and a method for fabricating the split gate field effect transistor (FET) device, wherein the split gate field effect transistor (FET) device is fabricated with enhanced areal density and enhanced performance.

The present invention realizes the enhanced areal density of the split gate field effect transistor (FET) device by fabricating the split gate field effect transistor (FET) device with a channel region contained completely within a trench within a semiconductor substrate within which is fabricated the split gate field effect transistor (FET) device. The present invention realizes the enhanced performance of the split gate field effect transistor (FET) device by forming within the trench and covering only a lower sub-portion of the channel region a floating gate electrode which in turn has formed vertically and horizontally overlapping thereover within the trench a control gate electrode which covers an upper sub-portion of the channel region within the trench.

The split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) non-volatile semiconductor integrated circuit microelectronic memory fabrication such as but not limited to a flash memory fabrication.

Referring now to FIG. 1 to FIG. 5, there is shown a series of schematic cross-sectional diagrams illustrating the results of progressive stages of fabricating within a semiconductor integrated circuit microelectronic fabrication, and in accord with a preferred embodiment of the present invention, a split gate field effect transistor (FET) device in accord with the present invention.

Figure 1:
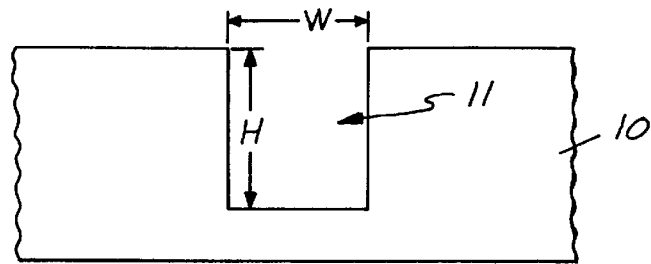
FIG. 1, FIG. 2, FIG. 3, FIG. 4 and FIG. 5 show a series of schematic cross-sectional diagrams illustrating the results of progressive stages of fabricating within a semiconductor integrated circuit microelectronic fabrication, and in accord with a preferred embodiment of the present invention, a split gate field effect transistor (FET) device in accord with the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a trench 11.

Within the preferred embodiment of the present invention with respect to the semiconductor substrate 10, and although semiconductor substrates are known in the art of semiconductor integrated circuit microelectronic fabrication with either dopant polarity, various dopant concentrations and several crystallographic orientations, for the preferred embodiment of the present invention, the semiconductor substrate 10 is typically and preferably a (100) silicon semiconductor substrate having either an N- or a P-doping of concentration about 5E10 to about 5E11 dopant atoms per cubic centimeter.

Similarly, within the preferred embodiment of the present invention with respect to the trench 11 formed within the semiconductor substrate 10, the trench 11 formed within the semiconductor substrate 10 may be formed employing any of several trench etch methods, and in particular anisotropic trench etch methods, as are conventional in the art of semiconductor integrated circuit microelectronic fabrication.

As is further illustrated within the schematic cross-sectional diagram of FIG. 1, the trench 11 formed within the semiconductor substrate 10 has a trench depth H within the semiconductor substrate 10 typically and preferably of from about 0.25 to about 0.5 microns. Similarly, and as is also further illustrated within the schematic cross-sectional diagram of FIG. 1, the trench 11 formed within the semiconductor substrate 10 also has a trench width W within the semiconductor substrate 10 typically and preferably of from about 0.2 to about 0.6 microns. The trench 11 formed within the semiconductor substrate 10 may define any of several areal trench shapes within the semiconductor substrate 10, but more typically and preferably the trench 11 will define a rectangular or a square areal trench shape within the semiconductor substrate 10, and most preferably the trench 11 will define a circular areal trench shape within the semiconductor substrate 10.

Figure 2:
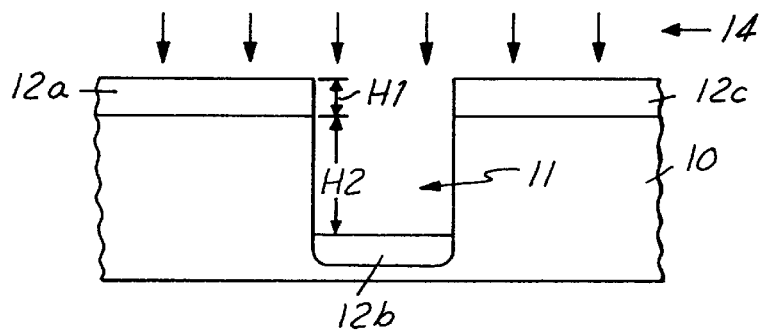

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is formed within: (1) a top surface upper portion of the semiconductor substrate 10 which includes an upper portion of a sidewall of the trench 11; and (2) a lower portion of the semiconductor substrate which includes a floor of the trench 11, a series of source/drain regions 12a, 12b and 12c, where: (1) the source/drain regions 12a and 12c typically and preferably serve as a contiguous drain region within a split gate field effect transistor (FET) device fabricated in accord with the preferred embodiment of the present invention; and (2) the source/drain region 12b typically and preferably serves as a source region within the split gate field effect transistor (FET) device fabricated in accord with the preferred embodiment of the present invention.

As is also illustrated within the schematic cross-sectional diagram of FIG. 2, the series of source/drain regions 12a, 12b and 12c is formed while employing a dose of implanting ions 14 implanted nominally orthogonally (i.e., within about seven degrees with respect to a normal) to the semiconductor substrate 10. Typically and preferably, the dose of implanting ions 14 is provided at an ion implantation dose of from about 5E14 to about 5E15 dopant ions per square centimeter and an ion implantation energy of from about 20 to about 50 kev. As is further illustrated within the schematic cross-sectional diagram of FIG. 2, the pair of source drain regions 12a and 12c are each formed to a depth H1 typically and preferably of from about 0.1 to about 0.2 microns including the upper portion of the sidewall of the trench 11, while also leaving a nominally ion unimplanted lower portion of the sidewall of the trench 11 of depth H2 from about 0.1 to about 0.3 microns. As is understood by a person skilled in the art, the nominally ion unimplanted lower portion of the sidewall of the trench 11 of depth H2 from about 0.1 to about 0.3 microns and interposed between the source/drain regions 12a and 12c and the source/drain region 12b comprises a channel region within a split gate field effect transistor (FET) device formed incident to further fabrication of the semiconductor integrate circuit microelectronic fabrication whose schematic cross-sectional diagram is illustrated in FIG. 2.

As is further understood by a person skilled in the art, and although the schematic cross-sectional diagrams of FIG. 1 and FIG. 2 illustrate: (1) first forming a trench within the semiconductor substrate 10; and (2) second forming within the semiconductor substrate 10 a series of source/drain regions 12a, 12b and 12c while employing the trench 11 as a self aligning structure, a functionally equivalent semiconductor integrated circuit microelectronic fabrication structure in accord with the schematic cross-sectional diagram of FIG. 2 may also be formed by employing a buried dopant for forming the source/drain region 12b prior to forming a trench, such as the trench 11, within a semiconductor substrate, such as the semiconductor substrate 10. Such a buried dopant may be formed employing high energy ion implantation methods and/or epitaxial deposition methods as are otherwise generally conventional in the art of semiconductor integrated circuit microelectronic fabrication.

Similarly, as is further also understood by a person skilled in the art, although the schematic cross-sectional diagram of FIG. 2 illustrates a single ion implant method for forming the series of source/drain regions 12a, 12b and 12c within various locations within the semiconductor substrate 10, there may also be employed additional ion implant methods to form within the semiconductor substrate 10 within the semiconductor integrated circuit microelectronic fabrication whose schematic cross-sectional diagram is illustrated in FIG. 2 additional ion implant structures, such as but not limited to additional threshold ion implant structures, as are conventional in the art of semiconductor integrated circuit microelectronic fabrication. Such additional ion implant structures are for example and without limitation disclosed with greater specificity within the references cited within the Description of the Related Art, the disclosures of all of which Related Art are incorporated herein fully by reference. Similarly, the present invention may be employed to further modify various of the inventions as disclosed within the Related Art.

Figure 3:
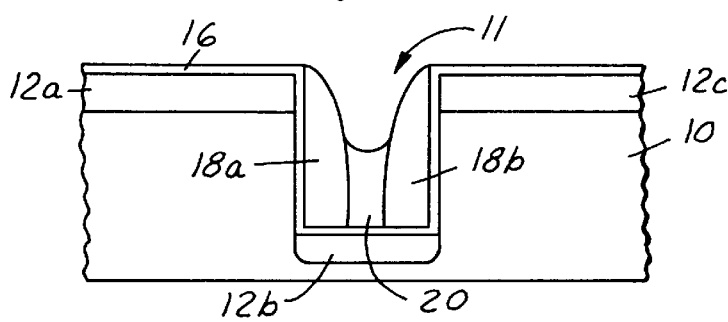

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there is formed conformally upon the semiconductor substrate and within the trench 11, and covering at least the channel region within the trench 11 but not filling the trench 11, a blanket gate dielectric layer 16.

Within the preferred embodiment of the present invention with respect to the blanket gate dielectric layer 16, and although it is known in the art of semiconductor integrated circuit microelectronic fabrication that gate dielectric layers may be formed employing methods including but not limited to gate dielectric layer thermal growth method and gate dielectric layer deposition methods, for the preferred embodiment of the present invention, the blanket gate dielectric layer 16 is typically and preferably formed employing a gate dielectric layer thermal growth method to form the blanket gate dielectric layer 16 of silicon oxide of thickness from about 80 to about 110 angstroms formed conformally upon the semiconductor substrate 10 and within the trench 11, while covering at least the channel region within the trench 11 but not filling the trench 11.

Shown also within the schematic cross-sectional diagram of FIG. 3 and formed upon each of the sidewalls of the trench 11 is a pair of unmasked anisotropically etched floating gate electrodes 18a and 18b (which under certain circumstances may generally comprise a single unmasked anisotropically etched floating gate electrode) each of which is formed generally in the shape of a spacer layer.

Within the preferred embodiment of the present invention with respect to the pair of unmasked anisotropically etched floating gate electrodes 18a and 18b, the pair of unmasked anisotropically etched floating gate electrodes 18a and 18b may be formed employing an anisotropic etching of a blanket floating gate electrode material layer formed of a floating gate electrode material as is otherwise conventional in the art of semiconductor integrated circuit microelectronic fabrication. Such floating gate electrode materials may be selected from the group including but not limited to metal, metal alloy, doped polysilicon (having a dopant concentration of greater than about 1E19 dopant atoms per cubic centimeter) and polycide (doped polysilicon/metal silicide stack) floating gate electrode materials, although doped polysilicon floating gate electrode materials are most typical, preferred and most common. As is illustrated within the schematic cross-sectional diagram of FIG. 3, the pair of unmasked anisotropically etched floating gate electrodes 18a and 18b is formed of a height sufficient to completely cover the pair of sidewalls of the trench 11, although a greater or lesser height may also be employed when forming the pair of unmasked anisotropically etched floating gate electrodes 18a and 18b.

Finally, there is also shown within the schematic cross-sectional diagram of FIG. 3, and masking a pair of lower facing portions of the pair of unmasked anisotropically etched floating gate electrodes 18a and 18b, a patterned masking layer 20.

Within the preferred embodiment of the present invention with respect to the patterned masking layer 20, the patterned masking layer 20 may be formed of masking materials as are conventional in the art of microelectronic fabrication, including but not limited to photoresist masking materials and hard masking materials, provided that the patterned masking layer 20 is formed of a masking material which serves as an effective mask for purposes of further anisotropic etching of the pair of unmasked anisotropically etched floating gate electrodes 18a and 18b.

More typically and preferably, the patterned masking layer 20 is formed of a photoresist masking material, and may be formed in the shape as illustrated within the schematic cross-sectional diagram of FIG. 1, for example and without limitation, by a controlled depth photoexposure of a blanket positive photoresist material layer, followed by development of the controlled depth photoexposed blanket positive photoresist material layer within a suitable positive photoresist material developer.

Alternatively, and also without limitation, when formed of a hard mask material, the patterned masking layer 20 may be formed of a blanket hard mask material layer, such as but not limited to a blanket silicon nitride hard mask material layer, which may be isotropically or anisotropically etched to provide the patterned masking layer 20 of shape as illustrated within the schematic cross-sectional diagram of FIG. 3.

As is understood by a person skilled in the art, although the schematic cross-sectional diagrams of FIG. 1 and FIG. 2 illustrate the present invention within the context of first forming the series of source/drain regions 12a, 12b and 12c within the semiconductor substrate 10 and then forming upon the semiconductor substrate 10 and within the trench 11 the blanket gate dielectric layer 16, a reverse or alternative ordering of the foregoing processing is also plausible within the context and scope of the present invention.

Figure 4:
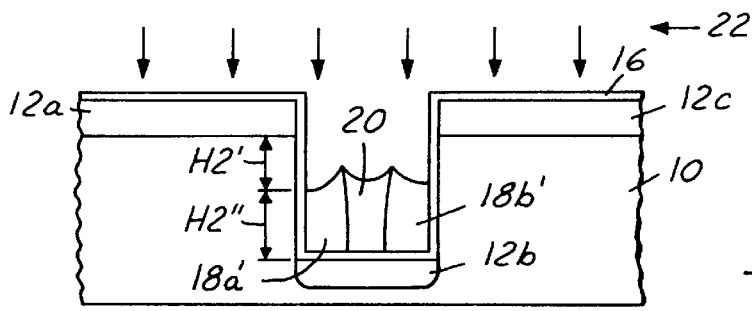

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the pair of unmasked anisotropically etched floating gate electrodes 18a and 18b has been further etched while employing an anisotropic etchant 22, and while masked with the patterned mask layer 20, to form a pair of masked further anisotropically etched floating gate electrodes 18a' and 18b' with a pair of generally sharp pointed tips separated from the sidewalls of the trench 11 and from the gate dielectric layer 16.

Within the preferred embodiment of the present invention, the pair of unmasked anisotropically etched floating gate electrodes 18a and 18b may be further etched while employing the anisotropic etchant 22, and while masked with the patterned mask layer 20, to provide the pair of masked further anisotropically etched floating gate electrodes 18a' and 18b'while employing as the anisotropic etchant 22 an anisotropic etchant analogous or equivalent to the an anisotropic etchant employed for forming the pair of unmasked anisotropically etched floating gate electrodes 18a and 18b from a blanket floating gate electrode material layer in a first instance. As is understood by a person skilled in the art, and as is illustrated within the schematic cross-sectional diagram of FIG. 1, the pair of masked further anisotropically etched floating gate electrodes 18a'and 18b' is formed with the pair of generally sharp pointed tips separated from the sidewalls of the trench 11 and the gate dielectric layer 16, such as to generally provide for enhanced erase speed and decreased erase voltage within a split gate field effect transistor (FET) device resulting from further fabrication of the semiconductor integrated circuit microelectronic fabrication whose schematic cross-sectional diagram is illustrated in FIG. 4.

As is illustrated within the schematic cross-sectional diagram of FIG. 4, each of the pair of unmasked anisotropically etched floating gate electrodes 18a and 18b as illustrated within the schematic cross-sectional diagram of FIG. 3 is further anisotropically etched to provide the pair of masked further anisotropically etched floating gate electrodes 18a' and 18b' which cover only a lower sub-portion of the lower portion of the sidewall of the trench (which lower portion of the sidewall of the trench comprises the channel region defined by the pair of source/drain regions 12a and 12c and the source/drain region 12b). As is illustrated within the schematic cross-sectional diagram of FIG. 4, the lower sub-portion of the lower portion of the sidewall of the trench has a trench lower sub-depth H2" (which corresponds with a floating gate channel width) typically and preferably of from about 0.1 to about 0.2 microns. The remaining upper sub-portion of the lower portion of the sidewall of the trench has a trench upper sub-depth H2' (which corresponds with a control gate channel width) of from about 0.1 to about 0.25 microns.

Figure 5:
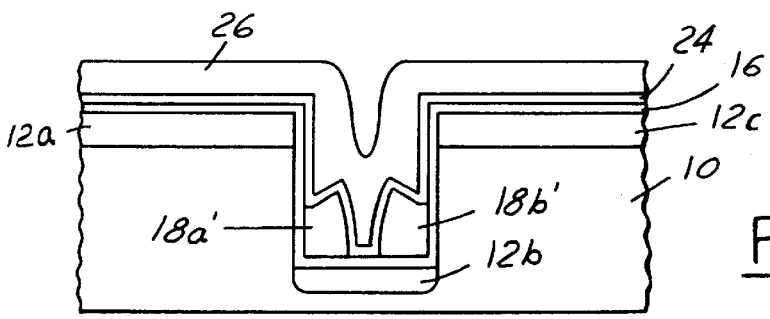

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, the patterned masking layer 20 has been stripped from the semiconductor integrated circuit microelectronic fabrication.

The patterned masking layer 20 may be stripped from the semiconductor integrated circuit microelectronic fabrication whose schematic cross-sectional diagram is illustrated in FIG. 4 to provide in part the semiconductor integrated circuit microelectronic fabrication whose schematic cross-sectional diagram is illustrated in FIG. 5 while employing stripping methods and materials as are otherwise conventional in the art of semiconductor integrated circuit microelectronic fabrication and appropriate for the masking material from which is formed the patterned masking layer 20.

Show also within the schematic cross-sectional diagram of FIG. 5, and after having stripped from the semiconductor integrated circuit microelectronic fabrication whose schematic cross-sectional diagram is illustrated in FIG. 4 the patterned masking layer 20, is: (1) a blanket intergate electrode dielectric layer 24 formed upon exposed portions of the blanket gate dielectric layer 16 and the masked further anisotropically etched floating gate electrodes 18a' and 18b'; and (2) a blanket control gate electrode 26 formed upon the blanket intergate electrode dielectric layer 24 while both vertically and horizontally overlapping within the trench the pair of masked further anisotropically etched floating gate electrodes 18a' and 18b' (including in particular the generally sharp pointed tips formed therein) and covering within the trench the upper sub-portion of the channel region designated by the trench upper sub-depth H2'. As is understood by a person skilled in the art such vertical and horizontal overlap within the trench 11 by the blanket control gate electrode 26 with the pair of masked further anisotropically etched floating gate electrodes 18a' and 18b', particularly with respect to the generally sharp pointed tips formed therein, similarly also provides enhanced erasing speed and reduced erasing voltage within the split gate field effect transistor (FET) device whose schematic cross-sectional diagram is illustrated in FIG. 5

Within the preferred embodiment of the present invention with respect to each of the blanket intergate electrode dielectric layer 24 and the blanket control gate electrode 26, each of the blanket intergate electrode dielectric layer 24 and the blanket control gate electrode 26 may be formed employing methods and materials as are otherwise generally conventional in the art of semiconductor integrated circuit microelectronic fabrication.

For example and without limitation, typically and preferably, the blanket intergate electrode dielectric layer 24 is formed of a composite silicon oxide silicon/silicon nitride/ silicon oxide intergate electrode dielectric material formed conformally upon the exposed portions of the blanket gate dielectric layer 16 and the masked further anisotropically etched floating gate electrodes 18a' and 18b' to a thickness of from about 150 to about 250 angstroms. Similarly, and also for example and without limitation, typically and preferably, the blanket control gate electrode 26 is formed upon the blanket intergate electrode dielectric layer 24 of a control gate electrode material analogous or equivalent to the floating gate electrode material from which is formed the pair of masked further anisotropically etched floating gate electrodes 18a' and 18b', and formed to a thickness of from about 1500 to about 2500 angstroms.

Upon forming the split gate field effect transistor (FET) device whose schematic cross-sectional diagram is illustrated in FIG. 5, there is provided in accord with the preferred embodiment of the present invention a split gate field effect transistor (FET) device, and a method for fabrication of the split gate field effect transistor (FET) device, wherein the split gate field effect transistor (FET) device is fabricated with enhanced areal density and enhanced performance.

The present invention realizes the enhanced areal density of the split gate field effect transistor (FET) device by fabricating the split gate field effect transistor (FET) device with a channel region contained completely within a trench within a semiconductor substrate within which is fabricated the split gate field effect transistor (FET) device. The present invention realizes the enhanced performance of the split gate field effect transistor (FET) device in part by forming within the trench and covering only a lower sub-portion of the channel region a floating gate electrode which in turn has formed vertically and horizontally overlapping thereover within the trench a control gate electrode which covers an upper sub-portion of the channel region within the trench.

As is understood by a person skilled in the art, the preferred embodiment of the present invention is illustrative of the present invention rather than limiting of the present invention. Revisions and modifications may be made to methods, materials, structures and dimensions which are employed for forming a split gate field effect transistor (FET) in accord with the preferred embodiment of the present invention, while still providing a split gate field effect field effect transistor (FET) device, and a method for fabrication thereof, in accord with the present invention, further in accord with the accompanying claims.

What is claimed is:

1. A split gate field effect transistor (FET) device comprising:
   a semiconductor substrate having formed therein a trench;
   a pair of source/drain regions one each formed within:
      an upper portion of the semiconductor substrate which includes an upper portion of a sidewall of the trench; and
      a lower portion of the semiconductor substrate which includes a floor of the trench, the pair of source/drain regions being separated by a lower portion of the sidewall of the trench which defines a channel region;
   a gate dielectric layer formed covering at least the channel region but not filling the trench;
   a floating gate electrode formed upon the gate dielectric layer and covering only a lower sub-portion of the channel region and not an upper sub-portion of the channel region, the floating gate electrode being formed in the shape of a truncated spacer with a pointed tip separated from the sidewall of the trench and the gate dielectric layer;
   an intergate electrode dielectric layer formed upon the floating gate electrode; and
   a control gate electrode formed upon the intergate electrode dielectric layer, the control gate electrode vertically and horizontally overlapping within the trench the floating gate electrode and covering within the trench the upper sub-portion of the channel region.

2. The split gate field effect transistor (FET) device of claim 1 wherein the trench is formed with a depth of from about 0.25 to about 0.5 microns and a width of from about 0.2 to about 0.6 microns.

3. The split gate field effect transistor (FET) device of claim 1 wherein:
   the upper portion of the sidewall of the trench is of a depth from about 0.1 to about 0.2 microns within the trench;
   the upper sub-portion of the channel region is of a depth from about 0.1 to about 0.25 microns within the trench; and
   the lower sub-portion of the channel region is of a depth from about 0.1 to about 0.2 microns within the trench.

4. The split gate field effect transistor (FET) device of claim 1 wherein the gate dielectric layer is formed to a thickness of from about 80 to about 110 angstroms.

5. The split gate field effect transistor (FET) device of claim 1 wherein the intergate electrode dielectric layer is formed to a thickness of from about 150 to about 250 angstroms.

6. The split gate field effect transistor (FET) device of claim 1 wherein the control gate electrode is formed to a thickness of from about 1500 to about 2500 angstroms.

* * * * *